United States Patent
Nomura et al.

[11] Patent Number: 5,948,991
[45] Date of Patent: Sep. 7, 1999

[54] SEMICONDUCTOR PHYSICAL QUANTITY SENSOR DEVICE HAVING SEMICONDUCTOR SENSOR CHIP INTEGRATED WITH SEMICONDUCTOR CIRCUIT CHIP

[75] Inventors: Hiroshi Nomura, Nagoya; Yukihiro Kato, Kariya; Akira Shintai, Chita, all of Japan

[73] Assignee: Denso Corporation, Kariya, Japan

[21] Appl. No.: 08/979,799

[22] Filed: Nov. 26, 1997

[30] Foreign Application Priority Data

Dec. 9, 1996 [JP] Japan ................................. 8-328794
Dec. 10, 1996 [JP] Japan ................................. 8-329818

[51] Int. Cl.⁶ .................................................. G01L 9/02
[52] U.S. Cl. ............................. 73/727; 73/726; 438/53
[58] Field of Search ........................ 73/726, 727, 335.05, 73/514.01, 514.35; 338/42; 438/53, 51, 52; 324/694; 257/417, 418

[56] References Cited

U.S. PATENT DOCUMENTS 4,655,088   4/1987   Adams .
4,879,903  11/1989   Ramsey et al. .
5,544,529   8/1996   Mitani et al. .
5,595,939   1/1997   Otake et al. .

FOREIGN PATENT DOCUMENTS 0 322 122    6/1989   European Pat. Off. .
2 707 002   12/1994   France .
60-97817     5/1985   Japan .
62-175633    8/1987   Japan .
2-90633      3/1990   Japan .
7-209115     8/1995   Japan .
8-68709      3/1996   Japan .

*Primary Examiner*—Joseph L. Felber
*Attorney, Agent, or Firm*—Pillsbury Madison & Sutro LLP

[57] ABSTRACT

An IC chip for signal processing circuit is enclosed in a mold IC and a pressure sensitive element unit is integrally provided thereon. When the mold IC is housed in a case, the mold IC is fixed to the case under a state where ends of connector pins insert-molded to the case are electrically connected to external terminals of the mold IC. Thereby, a sensor signal is outputted from other ends of the connector pins. By integrating the IC chip for signal processing circuit in the mold IC, the IC chip for signal processing circuit can be protected against a contaminated environment at a location where the pressure sensitive element unit is arranged.

12 Claims, 7 Drawing Sheets

SEMICONDUCTOR PHYSICAL QUANTITY SENSOR DEVICE HAVING SEMICONDUCTOR SENSOR CHIP INTEGRATED WITH SEMICONDUCTOR CIRCUIT CHIP

CROSS REFERENCE TO RELATED APPLICATION

This application is based upon and claims the benefit of priority of prior Japanese Patent Applications No. H.8-328794 filed on Dec. 9, 1996 and No. H. 8-329818 filed on Dec. 10, 1996, the contents of which are incorporated by reference.

BACKGROUND OF THE INVENTION

1. Field of the Invention

The present invention relates to a semiconductor sensor device which can be used as, for example, a pressure sensor for detecting an intake pressure of an engine in an automobile.

2. Description of Related Art

FIG. 15 shows the constitution of a conventional intake pressure sensor for an automobile. A pressure sensitive element unit 101 is attached to one side of a ceramic substrate 100. The pressure sensitive element unit 101 includes by a sensor chip 101a and a glass base 101b and detects pressure of a medium to be measured (intake air of an engine). An IC (Integrated Circuit) chip for a signal processing circuit 102 is attached to other side of the ceramic substrate 100. The IC chip for a signal processing circuit 102 and the pressure sensitive element unit 101 are electrically connected to each other by wiring formed on the ceramic substrate 100 and bonding wires 103 and 104. A sensor signal in response to pressure detected by the pressure sensitive element unit 101 is outputted from the IC chip for signal processing circuit 102.

The ceramic substrate 100 is attached to a case 106 in which a terminal 105 is insert-molded. One end of the terminal 105 is electrically connected to the IC chip for signal processing circuit 102 via a bonding wire 107 and wiring on the ceramic substrate 100. The other end of the terminal 105 is exposed at a connector unit 106a of the case 106. Electric conduction to outside is performed at the other end of the terminal 105.

An upper lid 108 and a lower lid 109 having a pressure introducing hole 109a are attached to the case 106. The pressure is introduced from the pressure introducing hole 109a of the lower lid 109 to a pressure receiving chamber 110 and the introduced pressure is detected by the pressure sensitive element unit 101. Further, the upper lid 108, the lower lid 109 and the case 106 are constituted by resin. The upper lid 108 and the lower lid 109 are fixedly adhered to the case 106 by an adhesive agent 111. Also, the ceramic substrate 100 is fixedly adhered to the case 106 by the adhesive agent 111. Due to fixation using the adhesive agent, the pressure receiving chamber 110 and a chamber (circuit chamber) 112 where the IC chip for signal processing circuit is disposed, are airtight. Further, an air vent hole 108a for escaping air from the inside during heating and curing operation, that is formed at the upper lid 108, is sealed by the adhesive agent 111.

A medium to be measured (air) introduced from the pressure introducing hole 109a includes exhaust gas and acidic condensed water produced by cooling the exhaust gas. Therefore, by providing the pressure sensitive element unit 101 for detecting pressure and the IC chip for signal processing circuit 102 for carrying out signal processing at separate chambers, the IC chip for signal processing circuit 102 can be protected against a contaminated environment of the pressure receiving chamber 110.

However, in order to provide the pressure sensitive element unit 101 and the IC chip for signal processing circuit 102 in separate chambers and maintain them in an airtight state, in addition to the airtight adhesion of the lower lid 109 and the case 106, airtight adhesion must be achieved between the upper lid 108 and the case 106, between the ceramic substrate 100 and the case 106 and at the air vent hole 108a in the upper lid. This is problematic in view of airtight reliability and complication of structure. Further, as a device capable of promoting the airtight reliability, there has been disclosed a device having the constitution where a metal diaphragm is used and displacement of the metal diaphragm is transmitted to a pressure sensitive element unit by silicone oil in Japanese Patent Application Laid-Open No. H.7-243926. However, when silicone oil is used, detection accuracy of pressure is lowered by thermal expansion thereof.

It is an object of the present invention to provide a semiconductor sensor device capable of protecting an IC chip for a signal processing circuit against a contaminated environment and still perform high accuracy detection without the need of providing a pressure sensitive element unit and the IC chip for signal processing circuit at separate chambers.

SUMMARY OF THE INVENTION

In order to achieve the above-described object, according to the present invention, an IC chip for a signal processing circuit is integrated (enclosed) in a mold IC and a pressure sensitive element unit is integrally provided thereon. The mold IC constituted as described above is housed in a case. When the mold IC is housed in the case, the mold IC is fixed to the case under a state where ends of connector pins insert-molded to the case are electrically connected to external terminals of the mold IC. Thereby, a sensor signal is outputted from other ends of the connector pins. By integrating the IC chip for signal processing circuit in the mold IC, the IC chip for signal processing circuit can be protected against a contaminated environment at a location where the pressure sensitive element unit is arranged.

The pressure sensitive element unit and the IC chip for the signal processing circuit can be electrically connected specifically by using lead frames. In this case, the lead frames can be utilized as external terminals.

When an opening is formed at the mold IC and the pressure sensitive element unit is installed in the opening and further, the pressure sensitive element unit and the lead frames exposed by the opening are electrically connected by wire-bonding, the pressure sensitive element unit and the lead frames can be bonded excellently.

When the lead frame is constituted by 42 alloy and the mold IC is molded by a thermosetting resin, respective thermal expansion coefficients can be matched and therefore, the lead frames can be prevented from separating from the mold IC by thermal stress.

When the mold IC is fixedly adhered to the resin case by a resin injection type agent and the external terminals of the mold IC and the connector pins insert-molded in the case are covered by the resin injection type agent, also the external terminals and the connector pins can be protected against a contaminated environment in a pressure receiving chamber.

When an opening in a recessed shape is formed in a mold IC and a pressure sensitive element unit is arranged in the opening, it is preferable to form another recess portion at a portion opposed to the opening formed in the recessed shape on the rear face side of the mold IC. Thereby, when a resin block for forming the mold IC is molded, resistance to the resin flow is applied from both of the recessed opening for arranging the pressure sensitive element unit and the recess portion on the rear face side. Accordingly, the resin is not made to flow deviating to one face side. As a result, a resin block having been excellently filled with resin can be formed without leasing bubbles in the resin block.

BRIEF DESCRIPTION OF THE DRAWINGS

These and other objects, features, and characteristics of the present invention will be appreciated from a study of the following detailed description, the appended claims, and drawings, all of which form a part of this application. In the drawings:

DETAILED DESCRIPTION OF THE PREFERRED EMBODIMENTS

Figure 1:
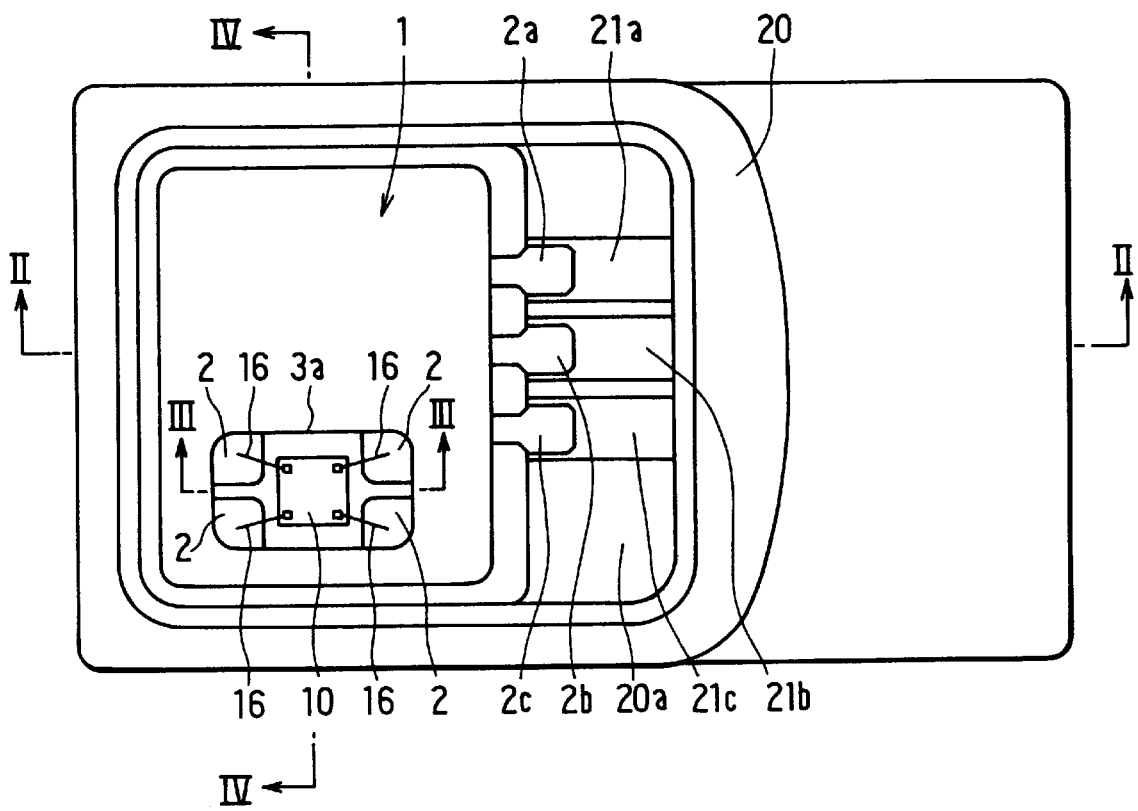
FIG. 1 is a plane view of a semiconductor type pressure sensor according to a first embodiment of the present invention.
Figure 2:
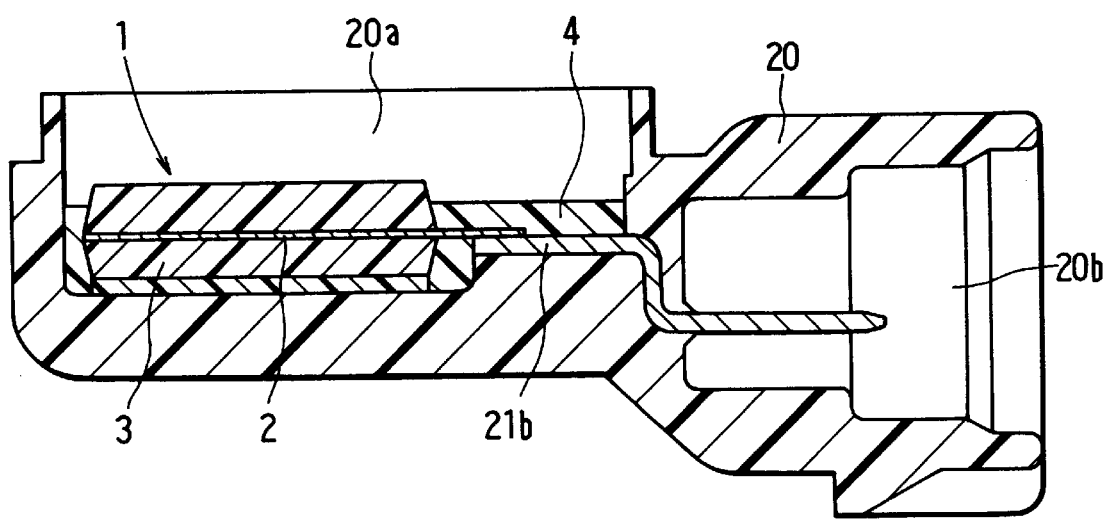
FIG. 2 is a sectional view taken from a line II—II in FIG. 1.
Figure 3:
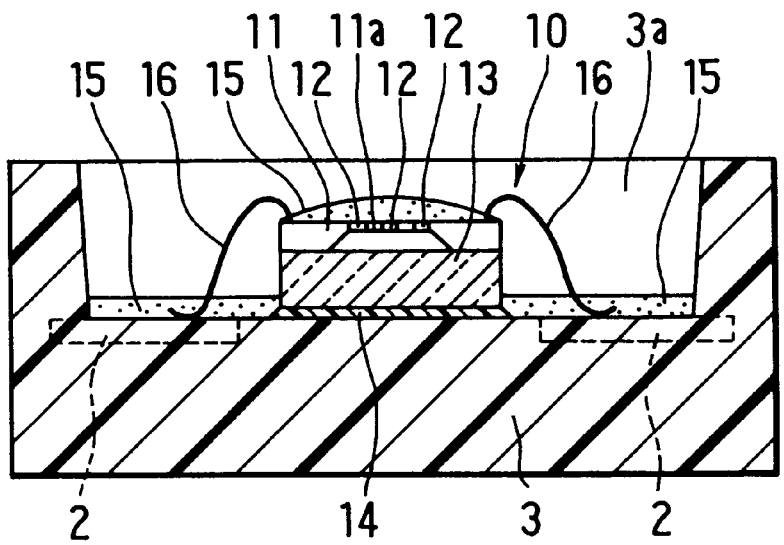
FIG. 3 is a sectional view taken along a line III—III of a mold IC shown by FIG. 1.
Figure 4:
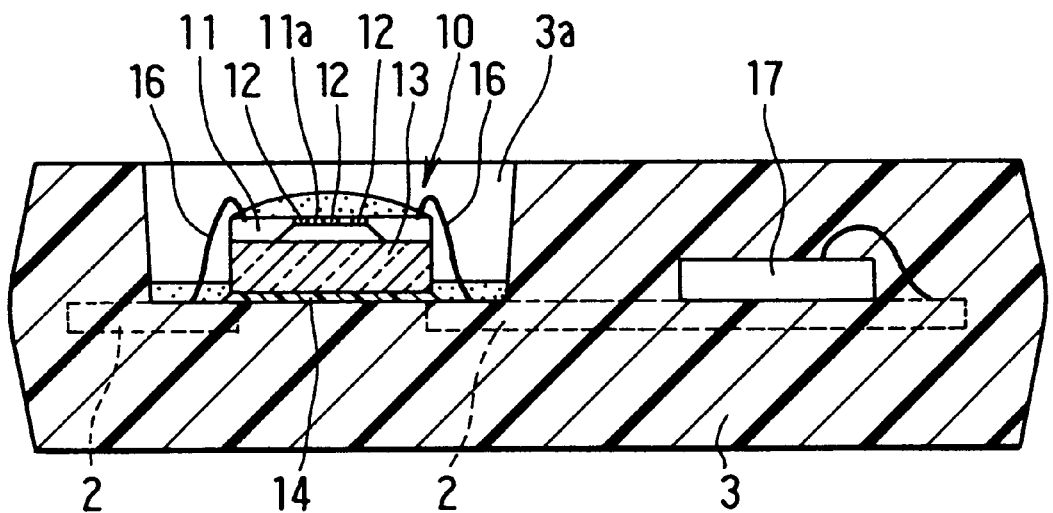
FIG. 4 is a sectional view taken from a line IV—IV in FIG. 1.

FIG. 1 through FIG. 4 show the constitution of a semiconductor type pressure sensor according to a first embodiment. FIG. 1 is a plane view thereof, FIG. 2 is a sectional view taken from a line II—II of a mold IC 1 in FIG. 1, FIG. 3 is a sectional view taken along a line III—III of the mold IC 1 shown by FIG. 1 and FIG. 4 is a sectional view taken from a line IV—IV of the mold IC 1 in FIG. 1.

The semiconductor type pressure sensor according to the first embodiment is used as an intake pressure sensor for an engine of an automobile which is constituted by housing a mold IC 1 in a case 20.

The mold IC 1 is formed by molding a resin block 3 with epoxy resin including a filler, inserting therein lead frames 2 constituted by 42 alloy. An opening 3a is formed in the resin block 3 of the mold IC 1. A pressure sensitive element unit (sensing unit) 10 for detecting pressure is mounted at inside of the opening 3a. As shown by FIG. 3 and FIG. 4, the pressure sensitive element unit 10 is constituted by a sensor chip 11 formed from a silicon substrate and a glass base 13 anodically bonded to the sensor chip 11. A diaphragm 11a displaced by receiving pressure is formed in the sensor chip 11. A diffusion gage 12, a resistance value of which is changed in accordance with the displacement of the diaphragm 11a, is formed on the surface of the diaphragm 11a. Further, a reference pressure chamber is formed between the sensor chip 11 and the glass base 13 and the diaphragm 11a is displaced in accordance with a difference between a pressure applied on the surface and a pressure in the reference pressure chamber. The pressure sensitive element unit 10 is fixedly adhered onto the resin block 3 inside of the opening 3a by a resin adhesive agent 14. Further, an organic gel-like protective member 15 is coated at the surrounding of the sensitive element unit 10 and on the pressure sensitive element unit 10. The protective member 15 not only protects the sensor chip 11 against contamination but electrically insulates the lead frames 2 from each other. Further, bonding wires 16, not coated with the gel-like protective member 15, are provided with an organic vapor-deposited film, not illustrated, by which the bonding wires 16 are electrically insulated from each other.

The diffusion gage 12 formed on the surface of the sensor chip 11 is electrically connected to the lead frames 2 by a wiring pattern of an aluminum thin film, not illustrated, that is formed on the sensor chip 11 and the bonding wires 16. As shown by FIG. 4, an electric signal thereof is outputted to an IC chip for signal processing circuit 17 provided on the lead frame 2 at inside of the mold IC 1 and is outputted as a sensor signal after performing a predetermined signal processing in the IC chip for signal processing circuit 17. That is, the IC chip for signal processing circuit 17 is electrically connected to three external terminals 2a, 2b and 2c constituted by the lead frames 2. The external terminal 2a, 2b and 2c respectively constitute a power source terminal, a ground terminal and a sensor signal output terminal of the IC chip for signal processing circuit 17.

The case 20 is made of resin, for example, PBT (polybutylene terephthalate). As shown by FIG. 2, the case 20 is provided with an opening 20a for housing the mold IC 1 and a connector unit 20b. Three connector pins 21a, 21b and 21c made of copper are inserted in the case 20. Ends of the connector pins 21a, 21b and 21c are respectively fixed to the external terminals 2a, 2b and 2c by welding in an electrically conducted state. Further, respective other ends of the connector pins 21a, 21b and 21c are exposed in the connector unit 20b and electric conduction to outside is executed by the exposed portions.

The mold IC 1 is fixed at inside of the opening 20a of the case 20 by a resin injection type agent (potting agent) 4. In this case, the external terminals 2a, 2b and 2c and the connector pins 21a, 21b and 21c are covered by the resin injection type agent 4 and therefore, water or the like can be prevented from invading from between the external terminals 2a, 2b and 2c and the resin block 3 to inside of the mold IC 1. Further, corrosion of the connector pins 21a, 21b and 21c is prevented so that electric leakage does not occur.

Figure 5:
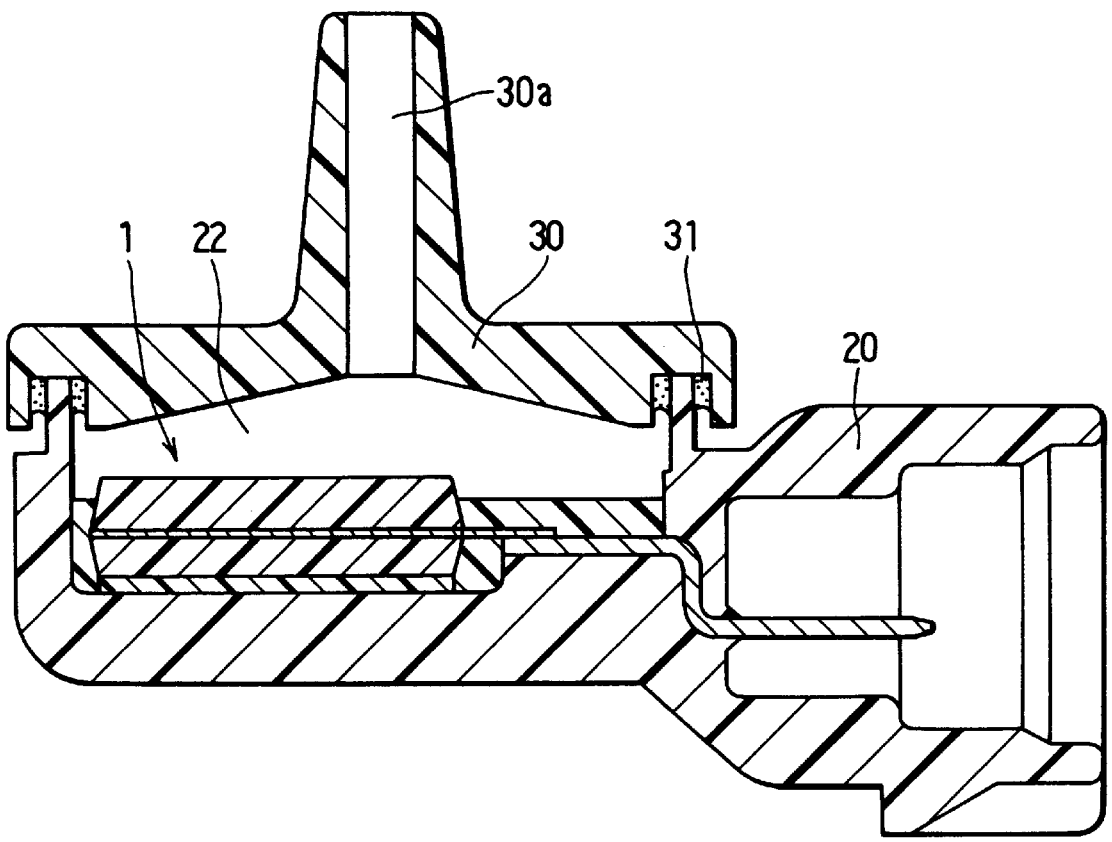
FIG. 5 is a sectional view showing the pressure sensor in a state where a lid 30 is attached to a case 20.

After mounting the mold IC 1 on the case 20, as shown by FIG. 5, the case 20 is attached with a lid 30. The lid 30 is provided with a pressure introducing hole 30*a* for introducing pressure to a pressure receiving chamber 22 in the case 20. The lid 30 is fixedly adhered to the case 20 by an adhesive agent 31 by which the pressure receiving chamber 22 is sealed from outside. Further, the pressure introducing hole 30*a* is connected to a surge tank via a rubber hose, not illustrated.

According to the above-described constitution, pressure of a medium to be measured (air) that is introduced into the pressure receiving chamber 22 via the pressure introducing hole 30*a* of the lid 30, is detected by the pressure sensitive element unit 10. The electric signal from the pressure sensitive element unit 10 is fed to the IC chip for signal processing circuit 17 via the bonding wires 16 and the lead frames 2. Further, the electric signal is amplified by the IC chip for signal processing circuit 17 and is outputted to outside as a sensor signal from the external terminal 2*c* and the connector pin 21*c*.

Although the pressure receiving chamber 22 is exposed to a contaminated environment as described in the conventional technology, the IC chip for signal processing circuit 17 can be protected against the contaminated environment in the pressure receiving chamber 22 since the IC chip for signal processing circuit 17 is enclosed (buried) in the mold IC 1. In addition, the external terminals 2*a*, 2*b* and 2*c* in the mold IC 1 and the connector pins 21*a*, 21*b* and 21*c* are covered with the resin injection type agent 4. Therefore, these can be protected against the contaminated environment of the pressure receiving chamber 22.

Because the mold IC 1 is fixedly housed in the case 20 and the inside of the pressure receiving chamber 22 can be maintained airtight only by adhering the lid 30 and the case 20 in an airtight whereby the airtight manner reliability can be promoted by the simple constitution.

A thermosetting resin (epoxy resin) is used for the resin block 3 and accordingly, the resin block 3 is provided with excellent contamination resistance. The thermal expansion coefficient of epoxy resin including a filler is 14 ppm which is comparatively near to the thermal expansion coefficient 4 ppm of 42 alloy that is the material constituting the lead frames 2. Therefore, the resin block 3 and the lead frames 2 can be prevented from separating from each other by thermal stress.

The present invention is not limited to the above-described first embodiment but can pertinently be changed within the range described in the scopes of claims. For example, as materials for constituting the mold IC 1 and the case 20 materials other than the above-described can be used.

Further, soldering, caulking or the like can be used other than welding in fixing the external terminals 2*a*, 2*b* and 2*c* and the connector pins 21*a*, 21*b* and 21*c*, respectively.

Further, the lead frames 2 and the connector pins 21*a*, 21*b* and 21*c* may comprise different metals as shown by the above-described embodiment or may comprise the same metal such as copper or the like. In this case, a signal line for transmitting a signal from the IC chip for signal processing circuit to the connector unit 20*b* may be constituted by one material.

Further, the pressure sensitive element unit 10 may not be disposed at inside of the opening 3*a* of the mold IC 1 so far as it is provided integrally with the mold IC 1. For example, the upper face of the mold IC 1 may be flattened and the pressure sensitive element unit 10 may be mounted thereon.

However, in consideration of the fact that the wire bonding is performed to the lead frames 2, it is preferable to arrange the pressure sensitive element unit 10 at inside of the opening 3*a* where the lead frames 2 are exposed as in the above-described embodiment.

Next, an explanation will be given of a second embodiment of the present invention in reference to FIG. 6 through FIG. 10.

Figure 6:
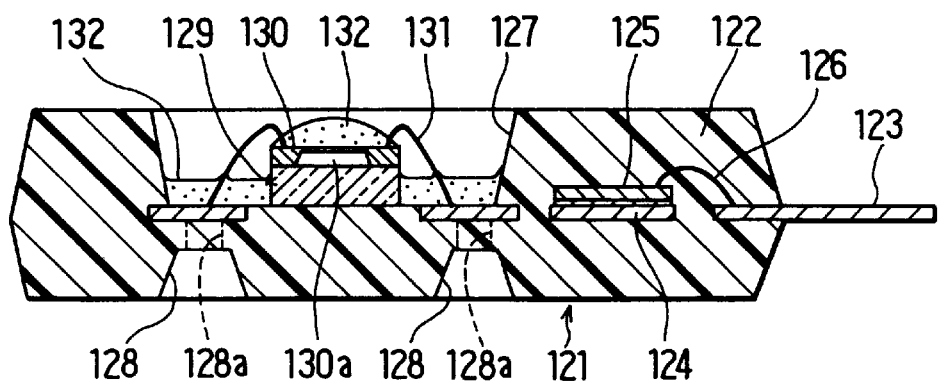
FIG. 6 is a sectional view showing a semiconductor type pressure sensor according to a second embodiment of the present invention.
Figure 7:
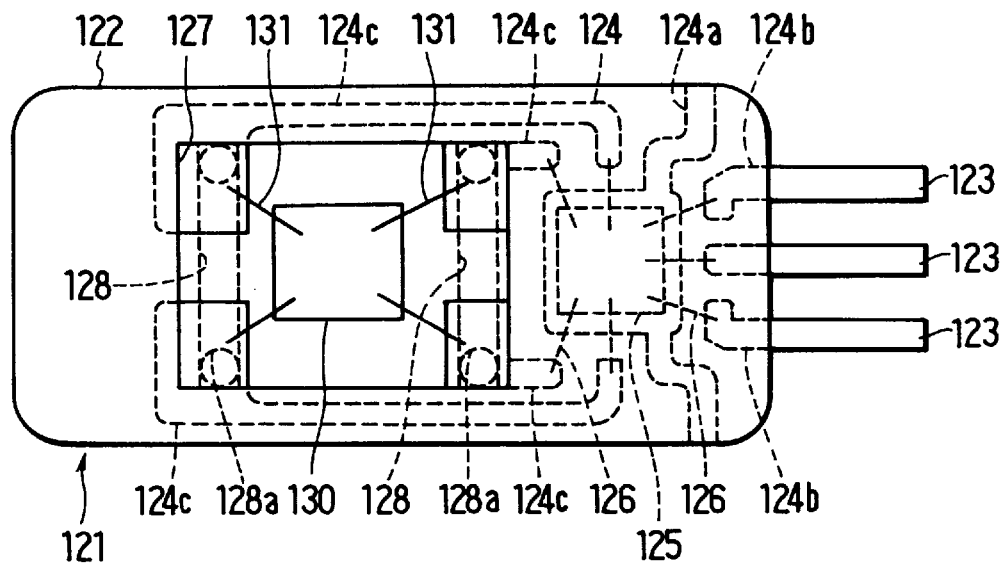
FIG. 7 is a plane view of the semiconductor type pressure sensor according to the second embodiment.

FIGS. 6 and 7 show a semiconductor type pressure sensor 121 according to the second embodiment. The sensor is used, for example, for detecting an intake air pressure of an engine, of which the pressure measuring range is, for example, about 10 kpa[abs] through 250 kPa[abs]. Intake air that is a medium for pressure to be detected includes exhaust gas, acidic condensed water produced by cooling the exhaust gas, and the like. Therefore, the semiconductor type pressure sensor 121 is used under a contaminated environment.

The semiconductor type pressure sensor 121 is formed to lead out three terminals 123 from one end face side of a resin block 122 in a rectangular vessel shape formed by the transfer molding process, mentioned later. The three terminals 123 are provided in correspondence with a power source terminal, a signal output terminal and a ground terminal, respectively. At inside of the resin block 122, a lead frame 124 and an IC chip for signal processing circuit 125 mounted on a lead portion for a signal processing circuit 124*a* of the lead frame 124 are enclosed.

The lead frame 124 is constituted by the lead portion for signal processing circuit 124*a*, three terminal lead portions 124*b* for constituting the terminals 123 and four lead portions for a pressure sensitive element unit 124*c*. When a sensor signal is fed to the IC chip for the signal processing circuit 125, the IC chip for the signal processing circuit 125 subjects the signal to signal processing and outputs it as a detected signal. Seven bonding pads formed on the surface of the IC chip for signal processing circuit 125 and respective portions of the lead frame 124 are electrically connected by bonding wires 126.

The resin block 122 is provided with a sensor mount portion 127 formed in a rectangular recess on a side where the IC chip for signal processing circuit 125 is mounted. Ends of the lead portions for pressure sensitive element unit 124*c* of the lead frame 124 are exposed at four corners of the bottom face of the sensor mount portion 127. Further, on the rear face side of the sensor mount portion 127 of the resin block 122, two grooves 128 having a recess shape are formed as recess portions. The grooves 128 are to provide resistance to resin flow in molding the resin block 122, as mentioned later. Support pin holes 128*a* which penetrates the mold IC to expose the rear face of the lead portions for pressure sensitive element unit 124*c*, are formed at both ends of the respective recess grooves 128. The holes 128*a* are formed by support pins supporting the lead portions for pressure sensitive element unit 124*c*, which are inserted from the rear face side of the mold IC in molding the resin block 122.

A glass base 129 is fixedly adhered to the center of the sensor mount portion 127 formed as described above and on top thereof a pressure sensor chip 130 is adhered by anodic bonding. The pressure sensor chip 130 is formed from a silicon substrate. A diaphragm is formed by etching at the center portion of the pressure sensor chip 130. A hermetically enclosed space is formed between the pressure sensor chip 130 and the glass base 129. The space is used as a pressure reference chamber 130*a*. A plurality of resistors utilizing the piezo resistance effect are formed on the diaphragm portion of the pressure sensor chip 130. The plurality of resistors are connected to form a bridge circuit. Signal terminals and power source terminals of the bridge circuit are connected to four electrode pads of the pressure sensor chip 130, respectively.

The electrode pads at four corners of the pressure sensor chip 130 and exposed portions of the lead portions for pressure sensitive element unit 124c, are electrically connected by the bonding wires 131. A sensor signal outputted from the pressure sensor chip 130 is fed to the IC chip for signal processing circuit 125 via the bonding wires 131 and the lead portions for pressure sensitive element unit 124c. When the diaphragm of the pressure sensor chip 130 is displaced by receiving pressure, the resistance values of the resistors are changed by the piezo resistance effect. Therefore, the balanced state of the bridge circuit is not maintained and the sensor signal corresponding to the pressure is outputted.

When the pressure sensor chip 130 is mounted, a resin 132 for protection use is coated on the diaphragm of the pressure sensor chip 130 and the surface portions of the lead portions for pressure sensitive element unit 124c to which the bonding wires 131 are connected. The resin 132 has a hardness to a degree whereby the pressure detecting operation of the pressure sensor chip 130 is not hampered. For example, a gel-like material of silicone resin group is used as the resin 132. The complex modulus of elasticity of the material is, for example, about $10^3$ through $10^5$ Pa. A thin coating agent is coated on the surface of the bonding wires 131, although not illustrated, whereby electrical insulating state is maintained even under a contaminated environment.

Figure 8:
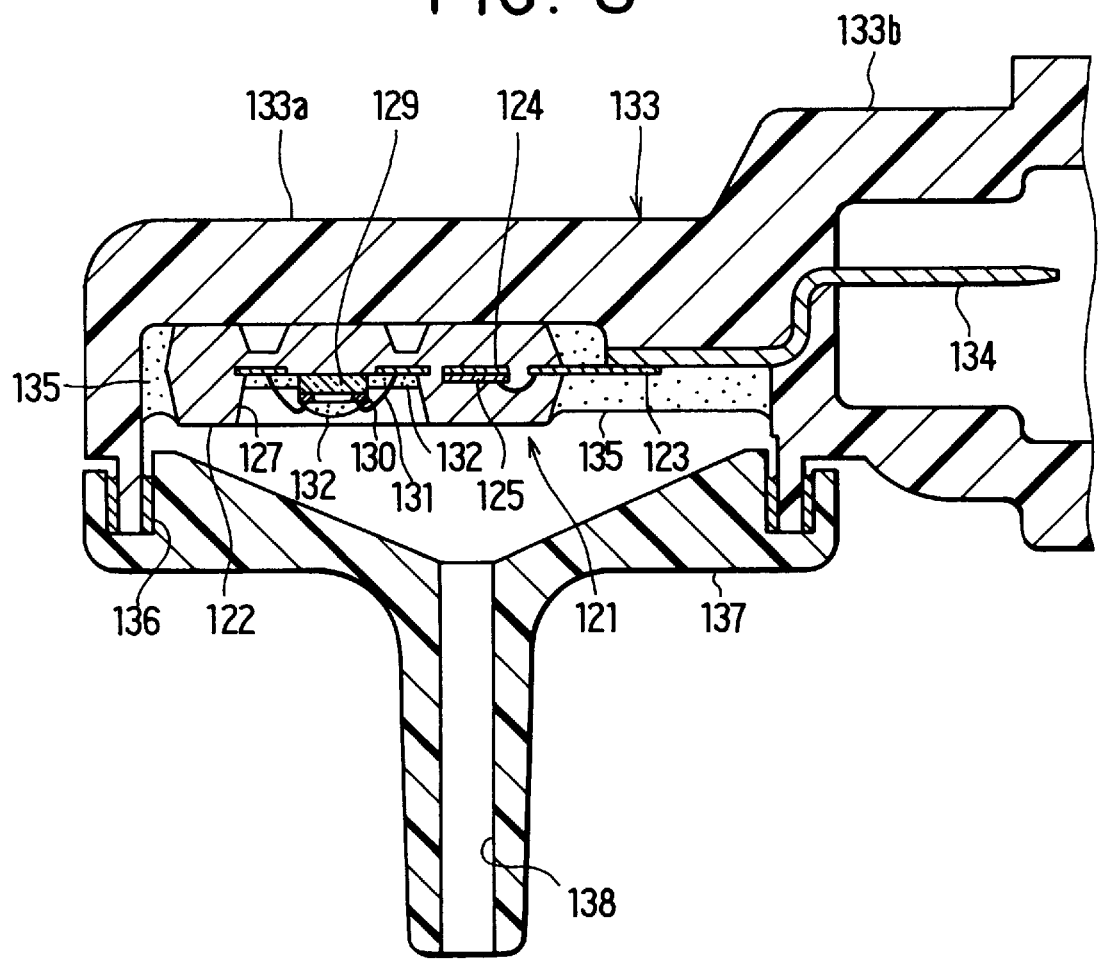
FIG. 8 is a sectional view showing the pressure sensor in a state where a mold IC is mounted to a main body case.
Figure 9:
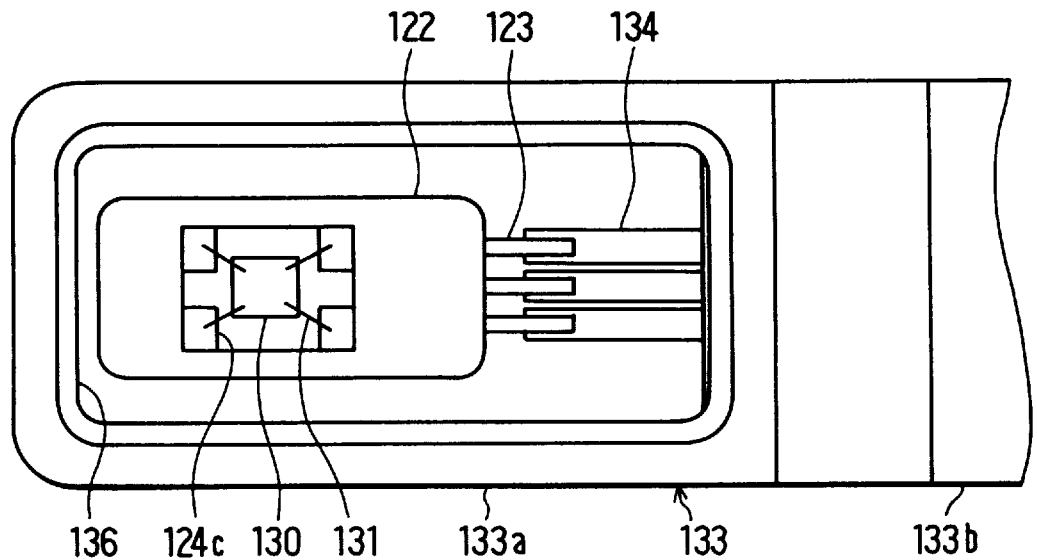
FIG. 9 is a plane view showing the pressure sensor in a state where a lid of the main body case is removed.

Next, an explanation will be given of a state where the semiconductor type pressure sensor 121 is mounted on a case 133. In FIGS. 8 and 9, the case 133 is formed by, for example, PBT resin. The case 133 is provided with a mounting portion 133a of which mounting face is opened and a connector portion 133b. Three connector pins 134 are insert-molded in the case 133 so that one end each of three connector pins 134 are exposed in the connector portion 133b.

The semiconductor type pressure sensor 121 is housed in the mounting portion 133a of the case 133. Three terminals 123 (three terminal lead portions 124b) and the connector pins 134 are electrically connected by welding. Further, the resin block 122 of the semiconductor type pressure sensor 121 is sealed by a potting resin using a resin injection type agent (potting seal agent) 135. In this way, the semiconductor type pressure sensor 121 is fixedly adhered to the inside of the case 133.

The resin injection type agent 135 needs to have a hardness and an adhesiveness so that bubbles are not generated at the inside of the mounting portion 133a even when a negative pressure is applied via a gap between the mold IC and the inserted connector pins 134, the resin block 122 in which the IC chip for signal processing circuit 125 is enclosed, is solidly and fixedly adhered to the mounting portion 133a, and the welded portions of the terminals 123 and the connector pins 134 can be protected even under a contaminated environment. As such a resin injection type agent 135, for example, there are rubber of silicone resin group, resin of epoxy group and the like having the modulus of elasticity of about $10^5$ through $10^6$ Pa.

When the semiconductor type pressure sensor 121 is mounted in the case 133, a lid 137 made of PBT resin is fixedly adhered to an opening 136 of the mounting portion 133a. The lid 137 is provided with a pressure introducing hole 138 formed in a cylindrical shape at a center portion thereof.

Figure 10:
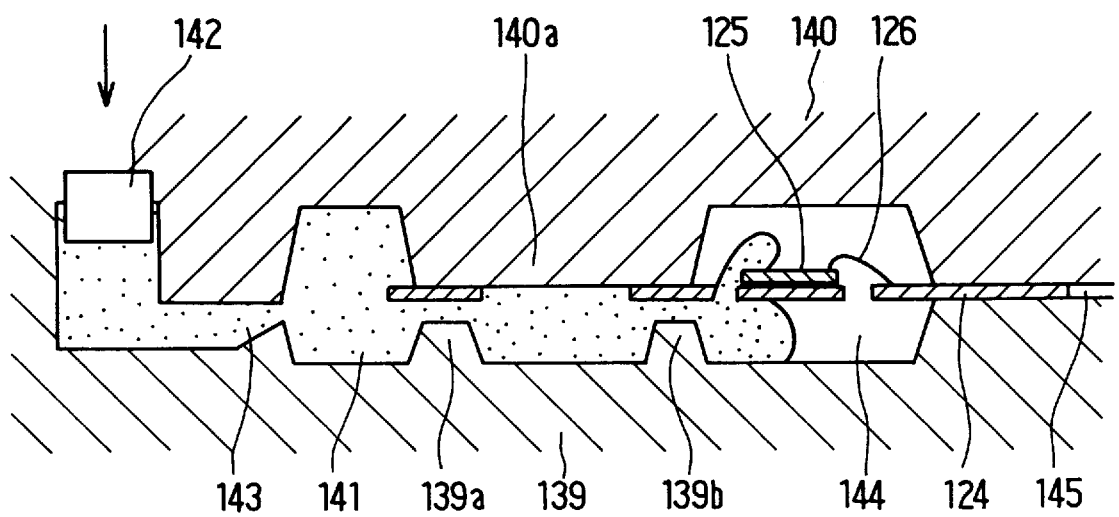
FIG. 10 is a sectional view showing a state where resin flows in molding a resin block.

Next, a simple explanation will be given of the procedure of molding the resin block 122 of the semiconductor pressure sensor 121. In FIG. 10 showing a state in which resin is flowing in a die unit during molding operation, the IC chip for signal processing circuit 125 is mounted on the lead frame 124. The bonding wires 126 are connected between the lead frame 124 and the IC chip for signal processing circuit 125. Under this state, the lead frame 124 is mounted on a predetermined portion of a lower die 139 and supported by support pins. Next, after closing the die unit by an upper die 140, a thermosetting resin 141 is injected into the die unit and is pushed in by a plunger 142. Thereby, when the thermosetting resin 141 is once molten by heat of the upper and lower dies 139 and 140, the thermosetting resin 141 flows in a cavity 144 between the upper and lower dies 139 and 140 via a gate 143 by pressure caused by the plunger 142. In this case, since an interval between a projection 140a of the upper die 140 (portion in correspondence with the sensor mount portion 127 of the resin block 122) and projections 139a and 139b of the lower die 139 (portions in correspondence with the grooves 128 of the resin block 122), is narrowed, the flow of the thermosetting resin 141 is retarded uniformly both at upper and lower sides of the lead frame 124 by receiving resistance from projections 140a, 139a and 139b. Thereby, the thermosetting resin 141 is filled into distal end portions of the cavity 144 without leaving bubbles. At this time, air at inside of the cavity 144 is discharged to outside via an air vent 145. The thermosetting resin 141 that is filled in this way, is further heated in the die unit, cured and solidified to thereby form the resin block 122. Thereafter, the molded product is taken out from the upper and lower dies 139 and 140 and cut at the gate 143 whereby the resin block 122 can be obtained.

According to the embodiment, the sensor mount portion 127 is formed in the resin block 122 in a state where the IC chip for signal processing circuit 125 is enclosed by the resin block 122 molded with the thermosetting resin 141. Therefore, it is not necessary to provide a coating agent for protecting the IC chip for signal processing circuit 125 against a contaminated environment when the IC chip for signal processing circuit 125 is mounted on the case 133, whereby assembling or mounting operation can be performed simply and inexpensively. Further, the enclosed state of the IC chip for signal processing circuit 125 can be maintained more excellently than using a thermoplastic resin or the like.

Because the sensor mount portion 127 for mounting the pressure sensor chip 130 on the resin block 122 is formed in a recessed shape, a member for separating the pressure sensor chip 130 from the resin injection type agent 135 for protecting the welded portions of the terminals 123 and the connector pins 134 needs not to be provided separately. Therefore, a number of parts can be reduced and a number of mounting steps can be reduced.

Further, two of the grooves 128 are provided in correspondence with the sensor mount portion 127 on the rear face side of the resin block 122. Therefore, a flow of the thermosetting resin 141 in the transfer molding operation is made uniform at both sides of the lead frame 124. As a result, the resin can be filled into distal end portions of the cavity 144 without leaving bubbles or the like at inside thereof, whereby the highly reliable resin block 122 can be fabricated. The grooves 128 and the support pin holes 128a are preferably filled with a soft resin. In this case, because support pin holes 128a are formed within the grooves 128, such a soft region can be easily applied in the support pin holes 128a.

Figure 11:
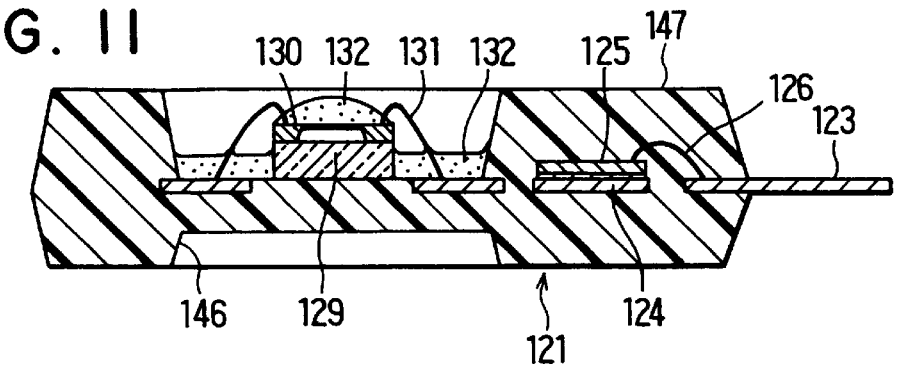
FIG. 11 is a sectional view showing a semiconductor type pressure sensor according to a third embodiment of the present invention.

FIG. 11 shows a third embodiment of the present invention. A difference from the second embodiment resides in that in place of the resin block 122, a resin block 147 in which a groove 146 is formed widely and shallowly on the rear face side of the resin block 147 is used. Dimensions of the groove 146 are set to be substantially equal to dimensions of the opening of the sensor mount portion 127. The depth dimension of the groove 146 can be set to be shallower than that of the first embodiment. Even with such a constitution, in molding the resin block 147 by the transfer molding, the thermosetting resin 141 can be made to flow uniformly at the upper and lower portions of the lead frame 124. As a result, the resin block 147 can be molded under a state where remaining air such as bubble is not present.

Figure 12:
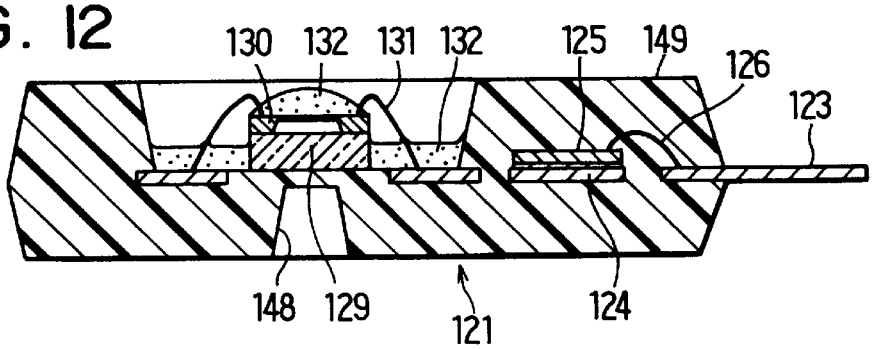
FIG. 12 is a sectional view showing a semiconductor type pressure sensor according to a fourth embodiment of the present invention.

FIG. 12 shows a fourth embodiment of the present invention and a difference thereof from the second embodiment resides in that in place of the resin block 122, a resin block 149 where a groove 148 is formed narrowly and deeply on the rear face side of the resin block is used. Even with the fourth embodiment, operation and effect substantially similar to those of the second embodiment can be obtained. Further, it is preferable that the thickness dimension of resin block on the rear face side of the sensor mount portion 127 is set to a degree whereby the strength can be maintained in mounting the pressure sensor chip 130.

Figure 13:
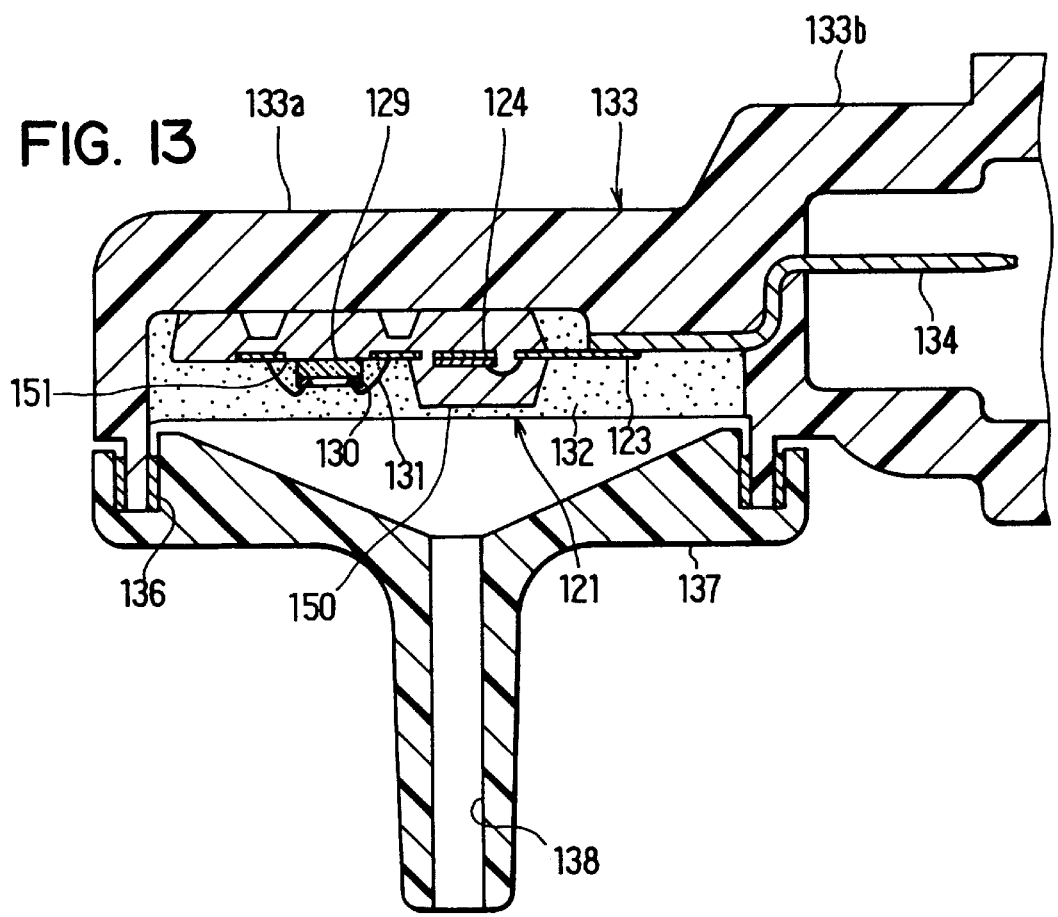
FIG. 13 is a sectional view showing a semiconductor type pressure sensor according to a fifth embodiment of the present invention.
Figure 14:
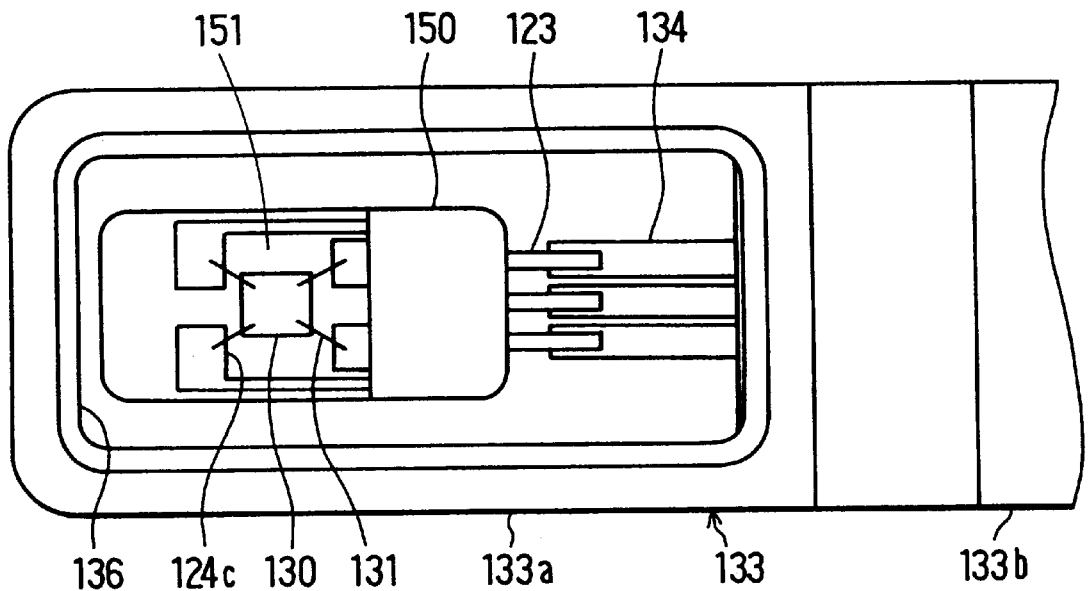
FIG. 14 is a plane view showing the pressure sensor in a state where a lid of a main body case is removed.
Figure 15:
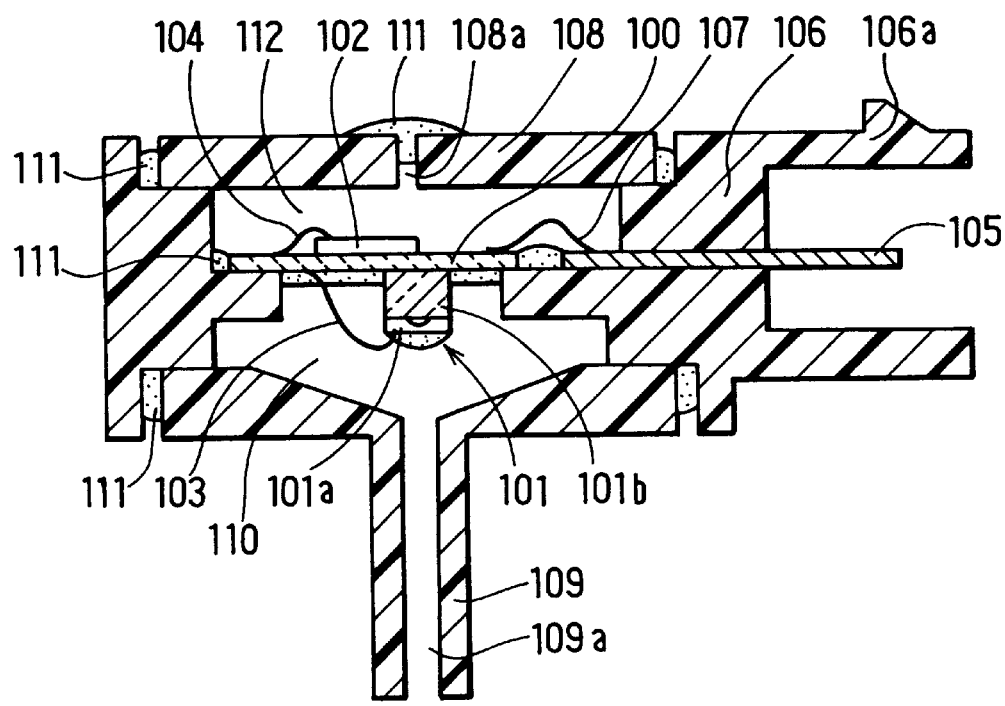
FIG. 15 is a sectional view showing a constitution of a conventional semiconductor type pressure sensor.

FIGS. 13 and 14 show a fifth embodiment of the present invention. A difference thereof different from the second embodiment resides in that in place of the resin block 122, a resin block 150 is provided. That is, according to the resin block 150, there is no portion for constituting a peripheral wall over the entire periphery of a sensor mount portion 151. The thermosetting resin is formed only at a portion where the IC chip for signal processing circuit 125 is mounted.

This embodiment is applied to the case where the resin 132 for protecting the pressure sensor chip 130 can be also used as a resin injection type agent for protecting welded portions of terminals 123 and the connector pins 134. When the resin block 150 is mounted in the case 133, the potting resin sealing is carried out by the resin 132 for protection such that a whole resin block 150 is covered. According to the fifth embodiment, the resin 132 for protection is filled to cover the pressure sensor chip 130 and the outer periphery of the resin block 150 simultaneously by potting of the resin such that the potting resin sealing can be carried out in accordance with the usage.

The present invention is not limited to only the above-described embodiments but can be modified or widened as follows.

The resin 132 for protecting the pressure sensor chip 130 may be filled over the entire region of the sensor mount portion 127.

The present invention is applicable to all of semiconductor sensor devices such as a hydraulic pressure sensor, a humidity sensor, a composition sensor, an optical sensor, an acceleration sensor and the like in which detecting operation is carried out under a state where semiconductor sensor chips undergo influence of detection atmosphere, in addition to the gas (air) pressure sensor.

What is claimed is:

1. A semiconductor sensor device comprising:

a semiconductor sensor chip which detects a physical quantity and generates a signal corresponding thereto;

a semiconductor circuit chip which processes said signal from said semiconductor sensor chip to generate a detection signal;

a lead frame having a semiconductor sensor lead portion for said semiconductor sensor chip to be electrically connected and a semiconductor circuit lead portion for said semiconductor circuit chip to be mounted; and a resin block in which said semiconductor circuit chip mounted on and electrically connected with said semiconductor circuit lead portion is enclosed therein, said resin block having a sensor mount portion at which said semiconductor sensor lead portion is exposed, and said semiconductor sensor chip being mounted on said sensor mount portion and electrically connected with said semiconductor sensor lead portion exposed at said sensor mount portion, wherein said sensor mount portion is formed in a recessed shape so that said resin block surrounds a periphery of said sensor mount portion, and wherein a groove is formed on a rear face side of said resin block in correspondence with said sensor mount portion, said groove providing resistance to a flow of resin in molding said resin block.

2. A semiconductor sensor device according to claim 1, wherein said resin block is formed by using a thermosetting resin.

3. A semiconductor sensor device according to claim 1, wherein said groove has a portion which does not reach said semiconductor sensor lead portion.

4. A semiconductor sensor device according to claim 1, wherein said groove has a first portion which does not reach said semiconductor sensor lead portion and a second portion which reaches said semiconductor sensor lead portion.

5. A semiconductor sensor device according to claim 4, wherein a longitudinal direction of said first portion is approximately perpendicular to a direction of said flow of resin in molding said resin block.

6. A semiconductor sensor device according to claim 1, wherein said second portion is formed in a region where said first portion is formed.

7. A semiconductor pressure sensor device comprising:

a semiconductor sensor chip which detects a pressure and generates a signal corresponding thereto;

a semiconductor circuit chip which processes said signal from said semiconductor sensor chip to generate a detection signal;

a lead frame having a semiconductor sensor lead portion for said semiconductor sensor chip to be electrically connected and a semiconductor circuit lead portion for said semiconductor circuit chip to be mounted; and a resin block in which said semiconductor circuit chip mounted on and electrically connected with said semiconductor circuit lead portion is enclosed therein, said resin block having a sensor mount portion at which said semiconductor sensor lead portion is exposed, and said semiconductor sensor chip being mounted on said sensor mount portion and electrically connected with said semiconductor sensor lead portion exposed at said sensor mount portion, wherein said sensor mount portion is formed in a recessed shape so that said resin block surrounds a periphery of said sensor mount portion, and wherein a groove is formed on a rear face side of said resin block in correspondence with said sensor mount portion, said groove providing resistance to a flow of resin in molding said resin block.

8. A semiconductor pressure sensor device according to claim 1, wherein said resin block is formed by using a thermosetting resin.

9. A semiconductor pressure sensor device according to claim 1, wherein said groove has a portion which does not reach said semiconductor sensor lead portion.

10. A semiconductor pressure sensor device according to claim 7, wherein said groove has a first portion which does not reach said semiconductor sensor lead portion and a second portion which reaches said semiconductor sensor lead portion.

11. A semiconductor pressure sensor device according to claim 10, wherein a longitudinal direction of said first portion is approximately perpendicular to a direction of said flow of resin in molding said resin block.

12. A semiconductor pressure sensor device according to claim 10, wherein said second portion is formed in a region where said first portion is formed.

* * * * *